(12) United States Patent
Gates et al.

(10) Patent No.: US 6,311,303 B1
(45) Date of Patent: Oct. 30, 2001

(54) MONITOR PORT WITH SELECTABLE TRACE SUPPORT

(75) Inventors: Stillman F. Gates, Los Gatos; Uday N. Devanagundy, Hayward, both of CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/089,278

(22) Filed: Jun. 2, 1998

(51) Int. Cl.[7] ............................. G01R 31/28; G01R 31/08
(52) U.S. Cl. ......................... 714/734; 714/724; 370/244
(58) Field of Search .................................. 714/724, 734, 714/729, 712; 370/241, 242, 244, 248

(56) References Cited

U.S. PATENT DOCUMENTS

| | | | |
|---|---|---|---|
| 4,439,858 | * | 3/1984 | Petersen ............................ 714/734 |
| 5,132,614 | * | 7/1992 | Sakumoto et al. .................. 324/763 |
| 5,189,675 | * | 2/1993 | Nozuyama et al. ................ 714/726 |
| 5,909,450 | * | 6/1999 | Wright ............................... 714/724 |

\* cited by examiner

*Primary Examiner*—Christine T. Tu
(74) *Attorney, Agent, or Firm*—Skjerven Morrill MacPherson LLP; David Millers

(57) ABSTRACT

An integrated circuit includes a monitor port, several circuit modules, and a selection circuit that selects which of the circuit modules drives internal signal through the monitor port. A debugging process can observe the internal signals at the monitor port to identify problems in the integrated circuit. In one embodiment, the selection circuit includes a trace bus that runs serially from the monitor port to each circuit module. Each module has tri-state buffers that connect the module to the trace bus. Alternatively, the selection circuit includes a multiplexer with input ports coupled to the modules. A trace select register controls which module drives the monitor port, and control registers or the current operation of each module select which set of internal signals the module applies to the tri-state buffers. Any of large number of internal signals can be selected and observed by programming the trace select register and the configuration registers for the modules. In one embodiment, the integrated circuit is a host adapter that includes modules operating in different clock domains.

13 Claims, 2 Drawing Sheets

MONITOR PORT WITH SELECTABLE TRACE SUPPORT

BACKGROUND

1. Field of the Invention

This invention relates to methods and interfaces for facilitating testing or debugging an integrated circuit.

2. Description of Related Art

Debugging a problem in an integrated circuit (IC) is generally easier using a simulation of the IC rather than an actual IC because a simulation allows a circuit designer to probe the state of every signal and register in every module of the IC. The same design, when in the form of an IC, is more difficult to debug because most signals that the designer wants to observe are internal signals that are not connected to any I/O cells. However, significant debugging of actual integrated circuits is often required before an IC design is fully operational under a variety of system conditions.

One way to observe an internal signal for debugging is with a probe that can contact a pad or other structure within an IC, to measure a signal at the contact point. However, the small size of such structures make probing extremely difficult. Additionally, such structures are generally inaccessible when the IC is fully packaged. Focused ion beam (FIB) technology provides one method of bringing an internal signals out of an IC. FIB techniques "jump" an internal signal that a designer wants to observe, to an output line. A cost of jumping an internal signal to an output line is the loss of the function of the output signal normally on the line. The designer may be able to jump an internal signal to a non-critical output signal, but finding enough non-critical output signals becomes more difficult as the number of internal signals to be observed increases. Further, using FIB technology becomes tedious and expensive if the internal signal and the output signal are widely separated in the IC.

Accordingly, methods and circuits that permit observation of internal signals for debugging of an IC are desired. Further, such methods and circuits are sought which can be used on packaged IC and do not required jumping of signals, alteration of the IC, or precise positioning of probes.

SUMMARY

In accordance with the invention, an integrated circuit, such as a host adapter IC, includes a monitor port, several circuit modules, and a selection circuit that selects which of the circuit modules drives an internal signal through the monitor port. The internal signal, while not required as output signals for the normal functions of the integrated circuit, are useful for debugging. A debugging process can observe the internal signals at the monitor port to identify problems in the integrated circuit. If a particular module is identified as having a problem, that module can be selected for driving the monitor port. Alternatively, the modules can be selected and observed one by one to identify which module may have a problem and the specific origin of the problem.

In one embodiment, the selection circuit includes a trace bus and enable lines. The trace bus runs serially from the monitor port to each circuit module, and each module has tri-state buffers that connect the module to the trace bus. The select circuit uses the enable lines, which are coupled to enable terminals of the tri-state buffers, to select which circuit module drives each line. Preferably, only one module drives all the trace bus lines simultaneously so that only one enable line is required per module. Alternatively, multiple modules can drive different lines (or bits) of the trace bus. An alternative selection circuit includes a multiplexer with input ports coupled to the circuit modules via parallel buses. In either embodiment, a trace select register controls which circuit module drives the monitor port, and control registers or the current operating mode of each module select which set of internal signals the circuit module applies to the monitor port. Accordingly, a large number of internal signals can be easily selected and observed through the monitor port when debugging the integrated circuit.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an embodiment of the invention, an integrated circuit includes a monitor port, a trace select register, and several modules. The modules implement the functions of the integrated circuit and generate internal signals which would normally be inaccessible. The monitor port connects to each of the modules, and the trace select register selects which of the modules drives internal signals for output from the monitor port. The internal signals can be observed during debugging of the integrated circuit.

Figure 1:
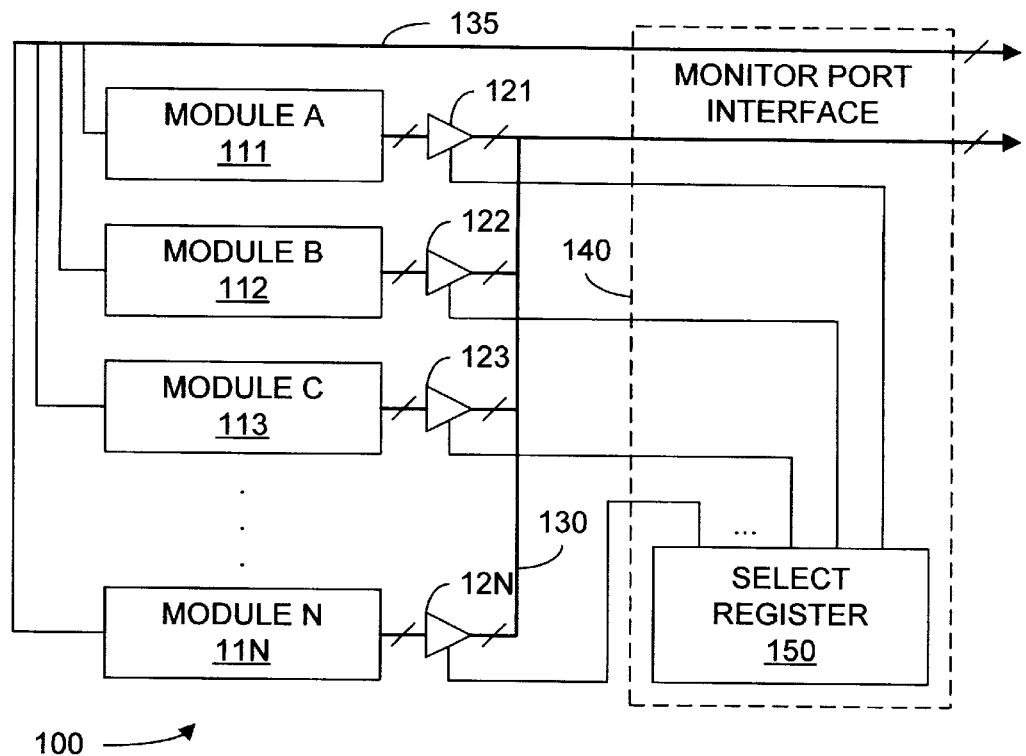
FIG. 1 is a block diagram of an integrated circuit containing a monitor port and trace bus in accordance with an embodiment of the invention.

FIG. 1 shows an integrated circuit 100 in accordance with an embodiment of the invention. Integrated circuit 100 includes several circuit modules 111, 112, 113, . . . 11N. Preferably, although not necessarily, each module 111 to 11N has specific discrete functions and contains the circuitry for implementing the functions. The functions implemented depend on the purpose of integrated circuit 100 and are not restricted by this invention. Generally, each module receives input signals from input cells (not shown) and other modules and generate output signals to the other modules and to output cells (not shown). Each module also generates signals which are used only within the module. As used herein, internal signals refer to all signals that are generated in integrated circuit 100 and not required for output from integrated circuit 100. This includes signals used only within a module and signals transmitted from one module to another. Each module 111 to 11N generates internal signals that might be useful for debugging integrated circuit 100 during the final stages of integrated circuit design and testing. In accordance with an aspect of the invention, a monitor port interface 140 in integrated circuit 100 is configurable to select and provide different sets of internal signals from modules 111 to 11N to output balls or pins which form a monitor port. The internal signals, although necessary internally, are unnecessary output for the functions of integrated circuit 100 and are output solely for debugging and testing of integrated circuit 100.

Monitor port interface 140 receives the internal signal via buses 130 and 135. Bus 130 runs from module to module in serial fashion. Each of modules 111 to 11N connects to bus 130 via an associated set of tri-state buffers 121 to 12N, and each module 111 to 11N applies a set of internal signals to its associated tri-state buffers 121 to 11N, respectively. The IC designer can select the set of signals from each module according to expected usefulness of the signals during debugging of the module. A trace select register 150 in monitor port interface 140 provides the signals to enable or disable tri-buffers 121 to 12N and thereby select the module that drives internal signals onto bus 130 for output through the monitor port. A value stored in trace select register 150 selects which tri-state buffers are enabled. In one embodiment of the invention, trace select register 150 contains one bit for each module 111 to 11N, and a single bit in register 150 is set to enable a corresponding one of tri-state buffers 120. Thus, one of modules 111 to 11N drives all of the lines of bus 130, while register 150 disables the tri-state buffers associated with all other modules. Alternatively, a decoder (not shown) attached to register 150 decodes the value in register 150 and generates signals that enable selected tri-state buffers 121 to 12N. Aside from the limitation that only one of modules 111 to 11N can drive a line of bus 130 at a time, the decoding of the value in register 150 can enable any combination of tri-state buffers from one or more sets of tri-state buffers 121 to 12N to select a desired combination of internal signals for output through the monitor port. Each module can further include a control register for selecting which of several sets of internal signals is applied to the tri-state buffers or can select a set of internals that corresponds to a current operating mode or operation of the module.

Bus 135 is coupled to the modules that generate "common" signals which are signals useful for debugging more than one section of IC 100. Examples of such common signals include signals indicating a source mode and a destination mode for a sequencer in IC 100. In an exemplary embodiment of the invention, such mode signals determine the currently available register set, the currently accessible portions of local memory, and many aspects of the IC's operation. Such signals are thus useful in debugging many portions of IC 100. The common signal are always output from the monitor port regardless of the value in register 150.

FIG. 1 shows monitor port interface 140 as providing internal signals as direct output from modules 111 to 11N or tri-state buffers 121 to 12N. Monitor port interface 140 can alternatively employ output cells, which are well known in the art. Such output cells, for example, can include latches or flip-flops which control the timing of changes in the output signals and/or buffers which control the levels of the output signal. Such output cells may be particularly useful when different ones of modules 111 to 11N operate in different clock domains.

Figure 2:
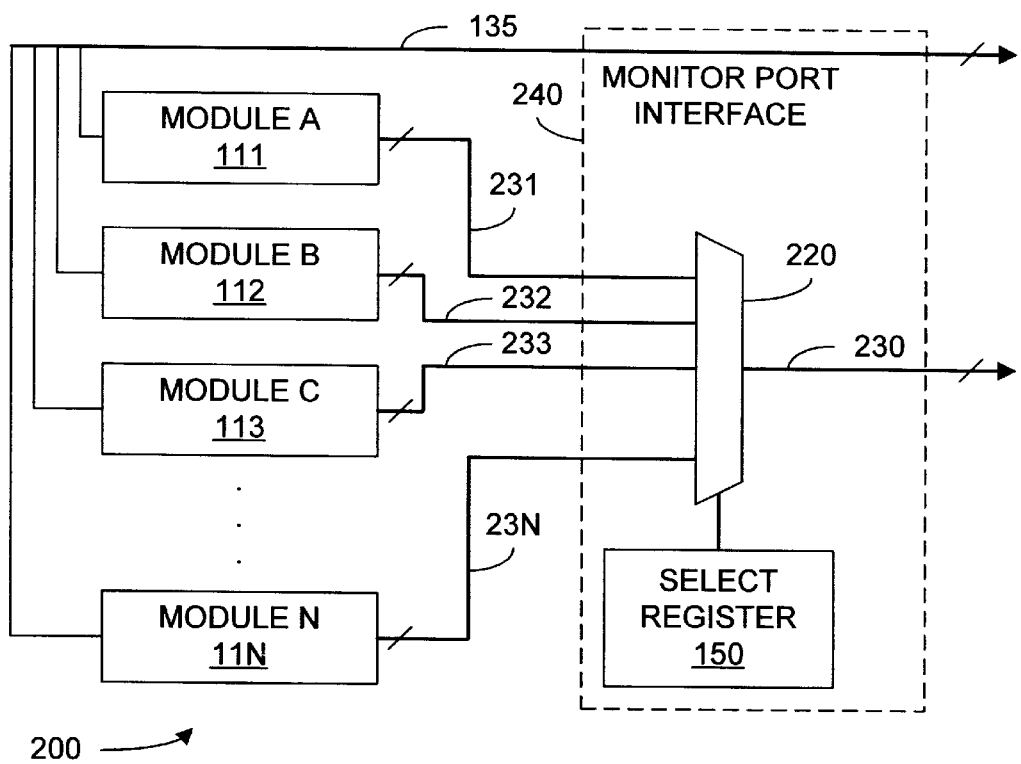
FIG. 2 is block diagram of an integrated circuit containing a monitor port and parallel trace buses in accordance with an embodiment of the invention.

FIG. 2 shows an integrated circuit 200 having a monitor port interface 240 in accordance with another embodiment of the invention. Integrated circuit 200 and monitor port interface 240 differ from integrated circuit 100 and monitor port interface 140 in that modules 111 to 11N in integrated circuit 200 have respective buses 231 to 23N which connect the modules to monitor interface 240. In monitor port interface 240, trace select register 150 applies a select signal to a multiplexer 220 to select which of module 111 to 11N (i.e., which bus 231 to 23N drives) an output bus 230 of the monitor port. Monitor port interface 240 requires more buses to route internal signals from modules 111 to 11N to the monitor port but does not require tri-state buffers for each module and does not require lines for enable signals for the tri-state buffers in the various modules. Accordingly, which of the two monitor interfaces 140 and 240 requires more circuit area and more complicated wiring depends on the number of internal signals to be output from the respective integrated circuit and on the layout of the modules in the integrated circuit.

Figure 3:
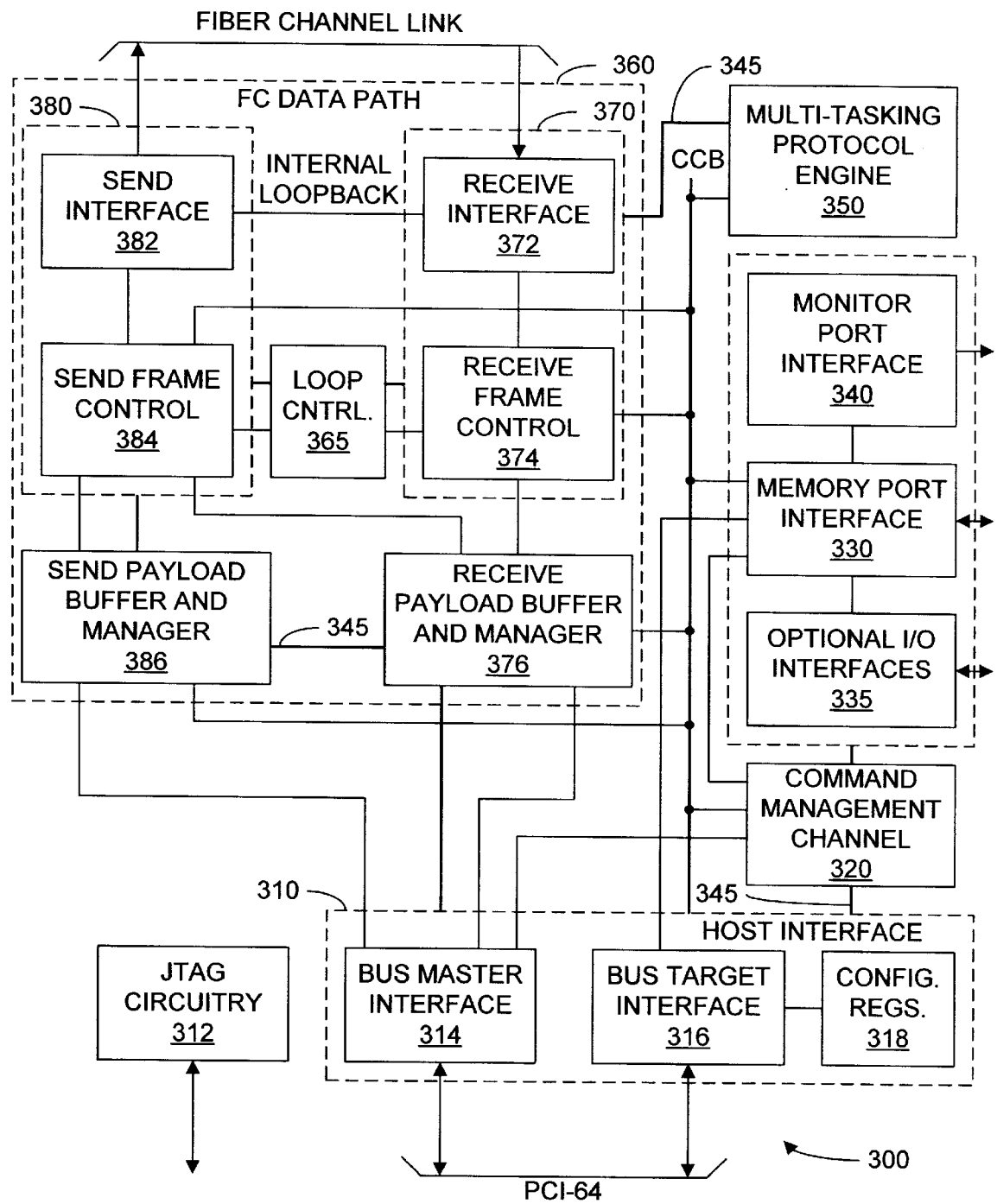
FIG. 3 is a block diagram of a host adapter in accordance with an embodiment of the invention.

In an exemplary embodiment of the invention illustrated in FIG. 3, the integrated circuit containing the monitor port and associated circuitry is a host adapter IC 300. This exemplary embodiment is described below to illustrate one specific embodiment of the invention. However, it should be understood that embodiments of the invention include and can be applied to any integrated circuit where a debugging process may need to observe internal signals. In the exemplary embodiment, host adapter 300 includes a host interface 310, a command management channel 320, a memory port interface 330 that includes a monitor port interface 340, a multi-tasking protocol engine (MTPE) 350, and a peripheral bus data path 360. Host adapter 300 can be used on a circuit board that connects to a system bus of a host computer and controls communications between the system bus and a peripheral bus to which peripheral devices are connected. As shown, the system bus is a PCI bus, and the peripheral bus is a fiber channel bus.

Host interface 310 connects to the system bus and implements bus protocols that permit adapter 300 to act as either the master or a target on the system bus. Some or all of the circuits in host interface 310 operate in a clock domain of a system bus clock. As illustrated in FIG. 3, host interface 310 includes a bus master interface 314 that implements PCI bus protocols for a bus master, and a bus target interface 316 that implements PCI protocols for a target on the system bus. Configuration registers 318 contain configuration data for host adapter 300 including a device base address, an IRQ, and configuration data for host adapter 300. In alternative embodiments of the invention, host interface 310 can employ any alternative host interface architecture including, for example, PCI interface circuits that are known in the art.

Command management channel (CMC) 320 contains a buffer and a DMA control circuit. CMC 320 handles DMA transfers between the main memory of the host computer and the buffer in CMC 320 and DMA transfers between the buffer in CMC 320 and a local memory of host adapter 300. The local memory includes volatile memory such as DRAM, SRAM, and synchronous SRAM and nonvolatile memory such as ROM, PROM, EPROM, EEPROM, and flash memory. The local memory may also include serial memory such as a serial EEPROM. Memory port interface 330 implements accesses of the local memory. In the exemplary embodiment of the invention, the buffer in CMC 320 has 128 bytes of storage, and the DMA control circuit handles DMA transfers of blocks up to 128 bytes, which is the size of a transfer control block for the exemplary embodiment of the invention.

Data path 360 is the path for information sent or received via a fiber channel link (i.e., the peripheral bus), and contains at least some circuits that operate in a clock domain of the fiber channel link. Data path 360 includes a receive data path for information received from the fiber channel link, a send data path for information to be sent on the fiber channel link, and a loop back control circuit 365 for performing self-checks of data path operations. The send data path includes a send payload buffer 386, a send frame control 384, and a send interface 382. The receive data path includes a receive interface 272, a receive frame control 374, and a receiver payload buffer 376. Co-filed U.S. patent application Ser. Nos. 09/089,311, now U.S. Pat. No. 6,070,200 issued May 30, 2000, 09/089,274, and 09/089,030 further describe the operation of an exemplary embodiment of data path 360 and components therein and are hereby incorporated by reference herein in their entirety.

MTPE 350 is a sequencer that controls information transfers as defined by transfer control blocks (TCBs) and scatter/gather (S/G) lists. MTPE 350 has its own processor clock and is multi-tasking in that MTPE 350 can control multiple simultaneous transfers. The host computer and command control channel 320 can store TCBs and S/G lists in the local memory via DMA transfers. For this, command control channel 320 has a direct connection to memory port interface 330 so that DMA transfers that do not interfere with communications on a main internal bus CCB. Bus CCB connects to protocol engine 350, memory port interface 330, data path 360, command management channel 320, and host interface 310. To access local memory, MTPE 350 must first acquire control of bus CCB from an arbitrator (not shown). MTPE 350 can then read from local memory via memory port interface 330. Host interface 310 or command management channel 320 can similarly acquire control of and communicate with other devices on internal bus CCB.

Memory port interface 330 provides an interface to the local memory. U.S. patent application Ser. No. 09/089,057, now U.S. Pat. No. 6,148,384 issued on Nov. 14, 2000 further describes a suitable memory port interface for the exemplary embodiment of the invention and is hereby incorporate by reference in its entirety. I/O interfaces 335 implement functions including a general purpose interface, an external request interface, an activity indicator interface, and a test interface. The general purpose interface includes generic, addressable pins for input and output signals. The external request interface provides for an external pause request and acknowledge for Peek/Poke operations, a firmware load request and acknowledge, and an external interrupt of host adapter 300. The activity indicator interface is an LED indicator output port for indicating the activity of host adapter 300. The test interface provides for initiation and output of results of self tests performed within host adapter 300, for example, by JTAG circuitry 312 for JTAG testing. Interfaces 335, while useful, are not required and can be omitted. Additionally, other types of interfaces can be added according to the functions of adapter 300.

Monitor port interface 340, which may be contained in memory port interface 330, selects internal signals from within host adapter 300 for external monitoring on output balls or pins of a monitor port. The monitor port interface 340 is generally for debugging of host adapter 300 during initial design and testing. For the view of monitor port interface 340, adapter 300 is divided into nine modules including MTPE 350, a module 370 including receive interface 372 and receiver frame control 374, loop controller 365, a module 380 including send interface 382 and send frame control 384, send payload buffer 386, receive payload buffer 376, host interface 310, CMC 320, and a module including memory port interface 330. Connected to monitor port 340 is a 12-bit trace bus 345 that runs in order from MTPE 350 through module 370, loop controller 365, module 380, send payload buffer 386, receive payload buffer 376, host interface 310, CMC 320, and memory port interface 330 to monitor port interface 340. Each module includes tri-state buffers and may include selection circuits that connect a selected set of internal signals to bus 345.

The trace select register for monitor port 340 is in the local address space so that MTPE 350 or a host connected to host interface 310 can write to the trace select register and select a module that drives the monitor port. Problems in a module can be debugged by writing a value to the trace select register so that internal signals from the module are output through the monitor port and then comparing the signals at the output to expected signals. The modules in adapter 300 are such that the internal signals relevant to a specific function are simultaneously output from the monitor port. This allows efficient debugging of detected problems.

When a default value 00h is in the trace select register, memory port interface 330 drives the trace bus. Memory port interface 330 selects one of three sets of twelve internal signals for output via monitor port interface 340. A first set of twelve internal signal is generated, used, and output through monitor port interface 340 while memory port interface 330 reads from an external serial EEPROM, typically during initialization of adapter 300. The first set of internal signals may include, for example, internal signals used for accessing the serial EEPROM. A second set of twelve internal signals is generated, used, and output through monitor port interface 340 while memory port interface 330 transfers to the host system data read from the external serial EEPROM. The second set of internal signals may include, for example, internal signals used for communication between memory port interface 340 and host interface 310. A third set of twelve internal signals is generated, used, and output through monitor port interface 340 after memory port interface 330 has transferred to the host system the data read from the external serial EEPROM, e.g., in normal operating mode after completing initialization of adapter 300. The third set of signals may include internal signals generated in access to local SRAM. Accordingly, when memory port interface 330 is selected, the internal signals provided at the monitor port depend on the current function of memory port interface 330.

When a value 01h is in the trace select register, MTPE 350 drives the trace bus and monitor port. MTPE 350 has four sets of twelve internal signals which can be output through the monitor port. Configuration bits for MTPE 350 select which set of twelve internal signals MTPE 350 drives onto the trace bus. When switching from one to another module driving trace bus 345, monitor port interface 340 disables tri-state buffers for one module before enabling the tri-state buffers for another module. For example, disabling an old set of tri-state buffers can occur a full clock cycle before enabling a new set of tri-state buffers. Timing of the switching of modules is not critical relative to the various clock domains of the different modules because the output signals from the monitor port are for connection to test circuitry that operates on whatever clock frequency is required for testing the selected module.

When a value 02h is in the trace select register, host interface 310 drives the trace bus and monitor port. Host interface 310 has six sets of twelve internal signals which can be output through the monitor port. Three sets are for debugging bus master functions, and three are for debugging bus target functions. Configuration bits for MTPE 350 select which set of twelve internal signals MTPE 350 drives onto the trace bus.

Trace select register values 03h, 04h, 05h, 06h, 07h, and 08h respectively select loop controller 365, command management channel 320, receive payload buffer 376, send payload buffer 386, receive module 370, and send module 380 for driving trace bus 345 and the monitor port. Loop controller 365 has two sets of twelve internal signals which can be output through the monitor port. Command management channel 320 has one set of twelve internal signals which can be output through the monitor port. Receive payload buffer 376 and send payload buffer have eight sets of twelve internal signals each. Receive module 370 and send module 380 have two sets of twelve internal signals each. Configuration bits for each of these modules select which set of twelve internal signals are output through the monitor port.

Although the invention has been described with reference to particular embodiments, the description is only an example of the invention's application and should not be taken as a limitation. Various adaptations and combinations of features of the embodiments disclosed are within the scope of the invention as defined by the following claims.

We claim:

1. An integrated circuit comprising:

an output port;

a plurality of circuit modules, wherein operation of each circuit module generates internal signals which are used internally and not required for output to implement a function of the integrated circuit; and a selection circuit coupled to the plurality of circuit modules and the output port, wherein the selection circuit selects which of the circuit modules drives internal signals through the output port for external monitoring.

2. The integrated circuit of claim 1, wherein the selection circuit comprises a first register that stores a value identifying which module drives internal signals through the output port.

3. The integrated circuit of claim 2, wherein the selection circuit further comprises:

a trace bus that runs serially from the output port to each of the circuit modules; and a plurality of lines coupled to the first register, the plurality of lines including at least one line for each of the circuit modules; and wherein each of the circuit modules comprises a set of tri-state buffers having output terminals coupled to the trace bus and an enable terminal coupled to the line for the circuit module.

4. The integrated circuit of claim 2, wherein the selection circuit further comprises a multiplexer that receives a select signal from the first register, the multiplexer having a plurality of input ports coupled to receive the internal signals from the plurality of circuit modules.

5. The integrated circuit of claim 2, further comprising a second register for a first of the circuit modules, wherein a second value in the second register selects a set of internal signals that the first circuit module drives through the output port when the value from the first register identifies the first circuit module.

6. The integrated circuit of claim 1, wherein when the selection circuit selects a first of the circuit modules, the first circuit module drives a first set of internal signals through the output port while performing a first function and drives a second set of internal signals through the output port while performing a second function.

7. A method for debugging an integrated circuit that includes:

an output port;

a plurality of circuit modules, wherein operation of each circuit module generates internal signals; and a selection circuit coupled to the plurality of circuit modules and the output port, wherein the selection circuit selects which of the circuit modules drives internal signals through the output port for external monitoring, the method comprising:

causing the selection circuit to select a first of the circuit modules;

operating the integrated circuit;

observing the internal signals at the output port to debug a problem in the first circuit module, wherein the internal signals observed at the output port are used internally and not required for output to implement a function of the integrated circuit.

8. The method of claim 7, wherein causing the selection circuit to select the first circuit module comprises writing to a first register in the selection circuit, a value that identifies the first circuit module, wherein in response to the value in the first register, the selection circuit causes the first module to drive internal signals through the output port.

9. A method for debugging an integrated circuit that includes:

an output port;

a plurality of circuit modules, wherein operation of each circuit module generates internal signals; and a selection circuit coupled to the plurality of circuit modules and the output port, wherein the selection circuit selects which of the circuit modules drives internal signals through the output port for external monitoring, the method comprising;

identifying that the first circuit module has a problem;

causing the selection circuit to select a first of the circuit modules, wherein causing the selection circuit to select the first circuit module is in response to identifying that the first circuit module has the problem;

operating the integrated circuit;

observing the internal signals at the output port to debug the problem in the first circuit module.

10. The method of claim 9, wherein causing the selection circuit to select the first circuit module comprises writing to a first register in the selection circuit, a value that identifies the first circuit module, wherein in response to the value in the first register, the selection circuit causes the first module to drive internal signals through the output port.

11. A method for debugging an integrated circuit that includes:

an output port:

a plurality of circuit modules, wherein operation of each circuit module generates internal signals; and a selection circuit coupled to the plurality of circuit modules and the output port, wherein the selection circuit selects which of the circuit modules drives internal signals through the output port for external monitoring, the method comprising:

causing the selection circuit to select a first of the circuit modules, wherein causing the selection circuit to select the first circuit module comprises activating a tri-state buffer that connects the first circuit module to a trace bus that runs serially from the output port to each of the circuit modules;

operating the integrated circuit;

observing the internal signals at the output port to debug a problem in the first circuit module.

12. A method for debugging an integrated circuit that includes:

an output port;

a plurality of circuit modules, wherein operation of each circuit module generates internal signals; and a selection circuit coupled to the plurality of circuit modules and the output port, wherein the selection circuit selects which of the circuit modules drives internal signals through the output port for external monitoring, the method comprising:

causing the selection circuit to select a first of the circuit modules, wherein causing the selection circuit to select the first circuit module comprises operating a multiplexer having a plurality of input ports coupled to receive the internal signals from the plurality of circuit modules so that the multiplexer selects the internal signals from the first circuit module for output through the output port;

operating the integrated circuit;

observing the internal signals at the output port to debug a problem in the first circuit module.

13. A method for debugging an integrated circuit that includes:

an output port;

a plurality of circuit modules, wherein operation of each circuit module generates internal signals; and a selection circuit coupled to the plurality of circuit modules and the output port, wherein the selection circuit selects which of the circuit modules drives internal signals through the output port for external monitoring, the method comprising:

causing the selection circuit to select a first of the circuit modules;

operating the integrated circuit, wherein operating the integrated circuit comprises:

driving a first set of internal signals from the first circuit module through the output port while performing a first function and observing the internal signals at the output port; and driving a second set of internal signals from the first circuit module through the output port while performing a second function and observing the internal signals at the output port;

observing the internal signals at the output port to debug a problem in the first circuit module.

* * * * *